US011101669B2

United States Patent
Patey et al.

(10) Patent No.: US 11,101,669 B2
(45) Date of Patent: Aug. 24, 2021

(54) STATE OF HEALTH ESTIMATION FOR BATTERIES

(71) Applicant: ABB Schweiz AG, Baden (CH)

(72) Inventors: Timothy Patey, Zürich (CH); Reto Flueckiger, Zürich (CH); Oleksandr Sologubenko, Bonstetten (CH); Andreas Zgraggen, Zürich (CH)

(73) Assignee: ABB Schweiz AG, Baden (CH)

( * ) Notice: Subject to any disclaimer, the term of this patent is extended or adjusted under 35 U.S.C. 154(b) by 208 days.

(21) Appl. No.: 16/535,186

(22) Filed: Aug. 8, 2019

(65) Prior Publication Data

US 2019/0363551 A1    Nov. 28, 2019

Related U.S. Application Data

(63) Continuation of application No. PCT/EP2018/053324, filed on Feb. 9, 2018.

(30) Foreign Application Priority Data

Feb. 9, 2017  (EP) .................................... 17155326

(51) Int. Cl.
  *H02J 7/00*   (2006.01)
  *G01R 31/3842*   (2019.01)
  *G01R 31/392*   (2019.01)

(52) U.S. Cl.
  CPC ........ *H02J 7/0021* (2013.01); *G01R 31/3842* (2019.01)

(58) Field of Classification Search
  CPC ...... H02J 7/0021; H02J 7/00; G01R 31/3842; G01R 31/392
  See application file for complete search history.

(56) References Cited

U.S. PATENT DOCUMENTS

| 7,109,685 B2 | 9/2006 | Tate, Jr. et al. |
| 7,619,417 B2 | 11/2009 | Klang |

(Continued)

FOREIGN PATENT DOCUMENTS

| CA | 2788893 A1 | 3/2013 |
| CN | 102216794 A | 10/2011 |

(Continued)

OTHER PUBLICATIONS

Chinese Patent Office, First Office Action issued in corresponding Application No. 201880011257.3, dated Dec. 31, 2020, 24 pp.

(Continued)

*Primary Examiner* — Vuthe Siek
(74) *Attorney, Agent, or Firm* — Taft Stettinius & Hollister LLP

(57) ABSTRACT

A method for determining a state of health of a rechargeable battery includes: determining a change in charge within an upper border and a lower border of a charging state window, the change in charge being determined by summing up current values measured within the charging state window; determining an actual state of health by scaling the change in charge with the width of the charging state window and dividing by an initial charging capacity of the battery; and determining an average state of health by calculating a sliding average of the actual state of health with at least one previous determined state of health.

20 Claims, 1 Drawing Sheet

(56) References Cited

U.S. PATENT DOCUMENTS

| | | | |
|---|---|---|---|
| 8,796,993 | B2 | 8/2014 | White et al. |
| 9,058,038 | B2 | 6/2015 | Zhang et al. |
| 9,244,132 | B2 | 1/2016 | Bond et al. |
| 2004/0162683 | A1 | 8/2004 | Verbrugge et al. |
| 2009/0128097 | A1 | 5/2009 | Esnard |
| 2010/0121587 | A1 | 5/2010 | Vian et al. |
| 2012/0310561 | A1 | 12/2012 | Middleton et al. |
| 2013/0038292 | A1 | 2/2013 | Barrett et al. |
| 2013/0245874 | A1* | 9/2013 | Magnet .................. B60K 6/48 701/22 |
| 2013/0262067 | A1 | 10/2013 | Zhang et al. |
| 2013/0274984 | A1* | 10/2013 | Justin .................. B60W 10/26 701/22 |
| 2014/0009123 | A1 | 1/2014 | Park et al. |
| 2014/0052396 | A1* | 2/2014 | Jin ...................... G01R 31/392 702/63 |
| 2014/0266227 | A1 | 9/2014 | Harman |
| 2015/0105948 | A1* | 4/2015 | Chang .................. B60L 58/13 701/22 |
| 2015/0256003 | A1* | 9/2015 | Yonetani ............... H02J 7/0021 320/150 |
| 2016/0221465 | A1* | 8/2016 | Kratzer ................. H02J 7/0021 |

FOREIGN PATENT DOCUMENTS

| | | |
|---|---|---|
| CN | 102662148 A | 9/2012 |
| CN | 103018679 A | 4/2013 |
| CN | 103364203 A | 10/2013 |
| CN | 105974323 A | 9/2016 |
| CN | 111983495 A | 11/2020 |
| DE | 102013205196 A1 | 10/2013 |
| KR | 102013306 B1 | 8/2019 |
| WO | 2010055271 A1 | 5/2010 |
| WO | 2012148019 A1 | 11/2012 |
| WO | 2012166489 A2 | 12/2012 |

OTHER PUBLICATIONS

Ren et al., "Design and implementation of a battery management system with active charge balance based on the SOC and SOH online estimation," Energy, vol. 106, 2019, pp. 908-917.

Shaohui, W., "Application Research on Battery Management System for Electric Vehicles," China Master's Theses Full-text Database, Engineering Science & Technology II, No. 12, 79 pp.

Xiaohui, T., "Application Research on Estimation of Lithium-ion Battery SOC," China Master's Theses Full-test Database, Engineering Science & Technology II, No. 2, 20 pp.

European Patent Office, International Search Report & Written Opinion issued in corresponding Application No. PCT/EP2018/053324, dated Jun. 12, 2018, 10 pp.

Berecibar et al., "Critical review of state of health estimation methods of Li-ion batteries for real applications," Renewable and Sustainable Energy Reviews, vol. 56, 2016, pp. 572-587.

* cited by examiner

STATE OF HEALTH ESTIMATION FOR BATTERIES

FIELD OF THE INVENTION

The invention relates to the field of charging of batteries. In particular, the invention relates to a method and a controller for determining a state of health of a rechargeable battery as well as to a method and a system for determining the state of health of a fleet of rechargeable batteries.

BACKGROUND OF THE INVENTION

Rechargeable batteries are increasingly being used to increase the self-use of solar photovoltaic power via an inverter and in other applications such as electrical vehicles, like cars and trains. Since rechargeable batteries have usually a shorter lifetime than the device they are employed in, the determination, when a rechargeable battery has to be exchanged, is an important task. For example, a state of health of the battery may be defined as the quotient of an actual maximal capacity and an initial maximal capacity of the battery. A battery may be exchanged, when the state of health has reached a specific threshold value.

Many regions of the world do not allow owners of small-scale (such as smaller than 10 kW) battery systems to discharge into the power grid, as it may disrupt the control of the power grid. This may be a problem to understanding the battery's health, as the most accurate method to measure state of health may be to conduct a full discharge, as the charging of the battery is usually limited to a variable charging power, such as from a photovoltaic and solar inverter powertrain.

Furthermore, battery properties usually vary strongly with temperature, age, state of charge, and current. Each of these variables may add to an error, when determining a state of health.

WO 2012 166489 A2 relates to a method and system for estimating battery health of a vehicle battery.

US 2010 121587 A1 relates to health management of rechargeable batteries.

US 2004 162683 A1 describes a method and apparatus for a generalized recursive least-squares process for battery state of charge and state of health.

US 2013 038292 A1 describes a management of battery charging through Coulomb counting.

US 2014/052 396 A1 relates to a method and device for measuring the capacity degradation of a battery. A state of health is determined by averaging capacity values of the battery, which are determined during a predetermined state of charge window, with a sliding window and dividing by a nominal capacity.

WO 2010/055 271 A1 relates to a method for determining the remaining life of an electrochemical power source. A state of health is determined iteratively by subtracting a value from a previous state of health, which value depends on temperature conditions of the battery during the last time span.

US 2014/009 123 A1 relates to a method for estimating a state of health of a battery. The state of health is determined by comparing ampere counting values based on measurements on the battery with such values determined from batteries with known degrading.

DESCRIPTION OF THE INVENTION

It is an objective of the invention to provide a simple and accurate way of determining a state of health of a rechargeable battery during normal operation of the battery.

This objective is achieved by the subject-matter of the independent claims. Further exemplary embodiments are evident from the dependent claims and the following description.

An aspect of the invention relates to a method for determining a state of health of a rechargeable battery. The rechargeable battery may be a battery for storing energy of a photovoltaic system, a battery of an uninterruptable power supply or a battery of an electric vehicle. In general, the state of health may be a number, such as a percentage value, which indicates that a battery is completely healthy (i.e. functional), in which case the state of health may be 100%, that the battery is completely unusable, in which case the state of health may be 0% and states in between.

The method may be performed by a controller of a battery system comprising the battery, which controller also may be adapted for controlling the charging and discharging of the battery. For example, the controller also may control a photovoltaic system or other system to which the battery is connected.

According to an embodiment of the invention, the method comprises: determining a change in charge within an upper border and a lower border of a charging state window, the change in charge being determined by summing up current values measured within the charging state window. The change in charge may be determined by "Coulomb counting", i.e. by discretely integrating the current flowing into or from the battery. This integrating or summing is performed in a charging state window, i.e. during a time, when the charging or discharging of the battery has reached a first border of the charging state windows (the upper border or the lower border) until a second border of the charging state window is reached (the other one of the upper and lower border). The borders may be provided as percentage values.

The controller performing the method may be adapted for receiving current measurement values of the battery current and may be adapted for processing these for determining the change in charge.

Furthermore, the controller performing the method may be adapted for determining, whether the charging window has been entered or left. To this end, the controller may determine a state of charge (or charging state) of the battery with a method that does not rely on Coulomb counting. For example, the state of charge, which may be defined as the quotient of an actual amount of charged energy and an actual maximal possible amount of energy chargeable of the battery, may be determined based on an actual battery voltage and/or other physical parameters of the battery and/or other methods based on statistical evaluations and/or on evaluating a computational model of the battery.

According to an embodiment of the invention, the method furthermore comprises: determining an actual state of health by scaling the change in charge with the width of the charging state window and dividing by an initial charging capacity of the battery. The actual state of health, i.e. a state of health value, is determined by extending the change in charge to a 100% charging state window, i.e. by dividing the change in charge by the width of the charging state window, which may be the difference between the upper border and the lower border. This scaled change in charge is then divided by the initial charging capacity, which, for example, has been measured in a first charging cycle of the battery.

It has to be noted that the actual state of health may be corrected with further factors that may depend on other physical states of the battery during the charging, as a battery temperature, a magnitude of the battery current, etc. This will be described below.

According to an embodiment of the invention, the method furthermore comprises: determining an averaged state of health by calculating a sliding average of the actual state of health with at least one previous determined state of health, such as a previously determined average state of health or previously determined states of health (which were then actual states of health). Averaged state of health values may be determined based on the actual state of health value and previously determined state of health values. The sliding average may have the advantage that an error due to extreme temperatures or currents may be smaller, thereby providing a more accurate estimation. Furthermore, large variations may be avoided by using the sliding average.

For example, the averaging window may comprise two or more states of health values. It may be that the states of health values are weighting in such a way that a more actual state of health value has a higher weight than an older state of health value.

It may be that the state of health determined with the method differs from a state of health that would be the result, when calculating it by completing charging or discharging the battery and determining a quotient of the actual charging capacity and an initial charging capacity. However, the averaged state of health determined with the method may be a good indicator for deciding, how aged the battery is.

With the method, the state of health may be determined during use through a charging power source (such as a photovoltaic system and solar inverter) or through a discharging load (such as residential or industrial loads). Furthermore, a discharge into a local grid is not necessary and/or the source and load connected with the battery may be fluctuating.

There is no need for a battery downtime for a diagnosis step, nor does the local power grid experience a power increase due to discharging of the battery. Close to end of lifetime of the battery, the degradation may be fast and the state of health may be determined more often, for example nearly every charging cycle, as with a conventional method, which usually is employed only every 100-200 days.

According to an embodiment of the invention, a charging state used for determining, whether the charging state window has been entered and has been left, is determined based on additional measurements with respect to the battery. As already mentioned, such a state of charge may be determined based on measurements of a battery voltage, i.e. a voltage across the battery, a battery temperature and/or other quantities such as pressure. It may be possible that the state of charge is determined based on statistical methods and/or a computational model of the battery.

According to an embodiment of the invention, the change in charge is determined during charging of the battery, when the charging state of the battery is increasing and/or the change in charge is determined during discharging of the battery, when the charging state of the battery is decreasing. It may be that the state of health determination is started every time, when the lower border or the upper border of the charging state window is reached. It also may be that the state of health determination is performed every charging cycle, or in regular intervals, such as every $10^{th}$ charging cycle.

According to an embodiment of the invention, during determining of the change in charge, an average temperature and/or an average current is determined, wherein the initial charging capacity is multiplied with a correction factor dependent on the average temperature and/or the average current for adapting the initial charging capacity to the average temperature and/or average current. The initial charging capacity may have been determined for or at a reference temperature and/or a reference current. Since the charging capacity usually depends on a temperature and/or a charging profile of the battery, this may be accounted for by adapting the initial charging capacity with respect to the temperature and/or current during the charging or discharging, when the change in charge is determined.

According to an embodiment of the invention, the correction factor is taken from a lookup table referenced by temperature and/or current. Such a lookup table may be generated for a specific type of battery. Alternatively, the correction factor also may be provided as function.

According to an embodiment of the invention, the average temperature and/or the average current is determined by measuring battery temperature values and/or battery current values and calculating an average of these values. The average temperature and/or the average current may be the arithmetic mean of the corresponding measurement values.

According to an embodiment of the invention, the borders of the charging state window are fixed values. These fixed values may be preset in the controller. For example, the upper border may be set between 90% and 50% of a charging capacity, such as 70%. The lower border may set between 70% and 30% of a charging capacity, such as 40%.

Alternatively, it may be that the borders of the charging state window are determined dynamically. For example, the borders may be dependent on historical data on charging and/or discharging of the battery.

According to an embodiment of the invention, the charging state window has a width of at least 25% of a charging capacity, such as 30%. The wider the charging state window, the more accurate the state of health determination may be.

According to an embodiment of the invention, the determination of the state of health is regularly repeated. It may be that the determination may be repeated, when a specific time interval, such as 10 days, has passed.

According to an embodiment of the invention, the determination of the state of health is repeated at least every 10 charging cycles. It also may be that the determination is repeated based on the charging cycles. A charging cycle may be a cycle, in which a battery is (virtually) completely charged and discharged, i.e. when the actual maximal capacity has been charged into the battery and discharged from the battery. Since the determination method for the state of health may be performed during a normal operation of the battery, it may be repeated very often, such as every 10 charging cycles, or even every charging cycle.

According to an embodiment of the invention, the determination of the state of health is only performed, when a temperature during determination of the change in charge is higher than a lowest temperature. Since a very low actual battery temperature may cause a high error in the actual state of health, such values may be omitted, when the battery temperature is lower than a threshold.

According to an embodiment of the invention, the method further comprises: determining an upper threshold temperature for the battery from the averaged state of health; controlling the charging and decharging of the battery, such that a temperature of the battery is lower than the upper threshold temperature. The controller may perform a health-conscious derating of the battery at critical temperatures. This may be done by applying a state of health dependent derating temperature limit, for example to slow down further degradation. For example, a maximal charging and/or decharging current may be decreased, when the actual temperature of the battery is higher than the upper threshold temperature. Such a derating may extend the lifetime of the battery.

For example, the upper threshold temperature and corresponding state of health values may be stored in a lookup table in a controller, which performs the method.

A further aspect of the invention relates to a battery charging controller adapted for performing the method as described in the above and in the following. For example, the method may be implemented as a computer program, which is executed by a processor in the controller.

A further aspect of the invention relates to a method for determining the state of health of a fleet of rechargeable batteries. A fleet of rechargeable batteries may be a plurality of rechargeable batteries of the same type and/or employed in the same type of application and/or owned by the same company. With the method for determining an average state of health of one battery, the health of all batteries of a fleet may be monitored.

According to an embodiment of the invention, the method comprises: receiving a state of health of one of the batteries of the fleet of batteries in a central database, the state of health being determined with the method as described in the above and in the below; comparing the state of health with a threshold value, and, when the state of health is below the threshold value, scheduling a replacement of the battery; and sending information about the scheduled replacement to a battery supplier and/or to an owner of the battery.

Since the date of replacement of a battery may not be predictable in advance, for example due to the fact that end users have different battery usage habits, the method may provide a possibility for exchanging batteries only, when they are really not usable any more. The method allows an almost real-time remote monitoring of the state of health of batteries in the field.

The central database may be communicatively connected with the battery controllers, for example via Internet. The state of health values of the fleet of batteries may be sent to the central database and stored there. The state of health values may be fed into the central database for the purpose of fleet monitoring and scheduling for battery replacements. For example, the battery owners may be informed that a battery may have to be replaced and/or a battery supplier may be informed that a new battery is needed. Such a network may ensure that battery owner's needs are met and that timely battery replacements are provided.

A further aspect of the invention relates to a battery management system comprising a central server adapted for performing the method as described in the above and in the following. For example, the method may be implemented in a computer program, which is executed by a processor of the central server. The central server also may house the central database. The battery management system may provide an ability to monitor the health of a battery and ensure a timely replacement of the battery for and battery owner. For a battery supplier, the system provides the ability to monitor the health of all batteries in a region, to schedule replacements, to reduce batteries on stock, and/or to monitor status of a battery versus its expected lifetime, for example as described in a warranty agreement.

It has to be understood that features of the method for determining a state of health for a battery as described in the above and in the following may be features of the battery charging controller as described in the above and in the following and/or by the battery management system as described in the above and in the following, and vice versa.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
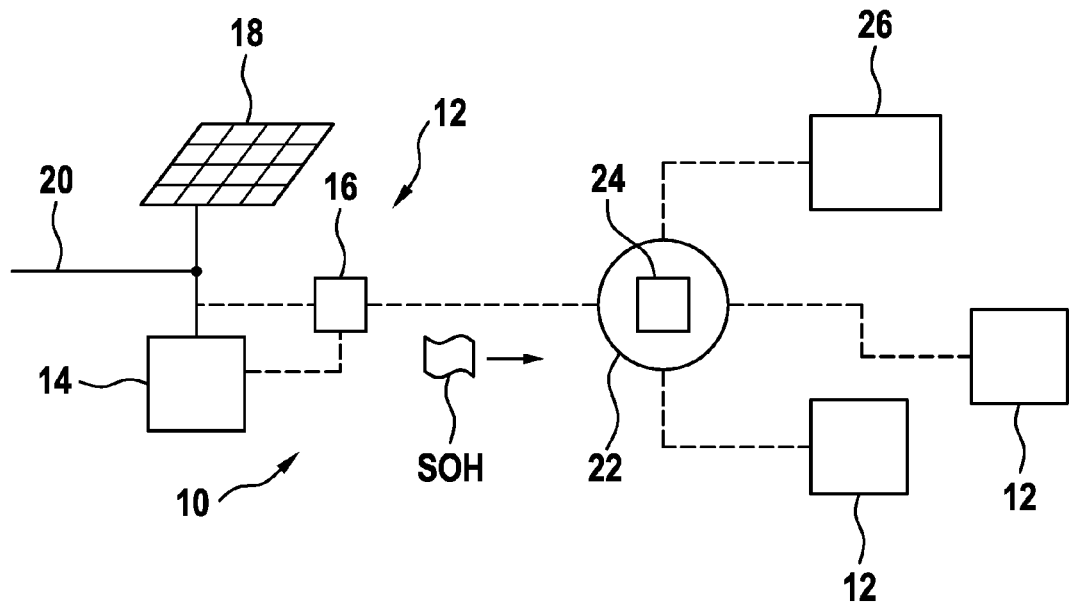
FIG. 1 schematically shows a battery charging and management system according to an embodiment of the invention.

FIG. 1 shows a battery charging and management system 10 comprising a battery system 12 with a rechargeable battery 14. The battery system 12 comprises a controller 16 adapted for controlling the charging and decharging of the battery 14. The controller 16 may be adapted for measuring a battery voltage, a battery current, a battery temperature and other physical quantities relating to the battery 14.

The battery system 12 may comprise further devices interconnected to the battery, such as a photovoltaic panel 18 and/or may be connected to an electrical grid 20. In general, the battery system 12 also may be part of an electrical vehicle, of an uninterruptable power source.

The controller 16 may be communicatively connected with a central server 22, which comprises a central database 24. For example, the communication connection may be provided via Internet. As described above and below, the controller 16 is adapted for determining a state of health SOH of the battery 14 and may send it to the central server 22, which may store it in the central database 24 with respect to information about the battery 14.

A plurality of battery systems 12 may be connected to the central server 22 in such a way, which may store the information about the state of health of the batteries of all these battery systems 12.

The central server 22 also may be communicatively connected with a battery supplier 26, which may receive information about supplied batteries 14 and/or about batteries 14 to be replaced.

Figure 2:
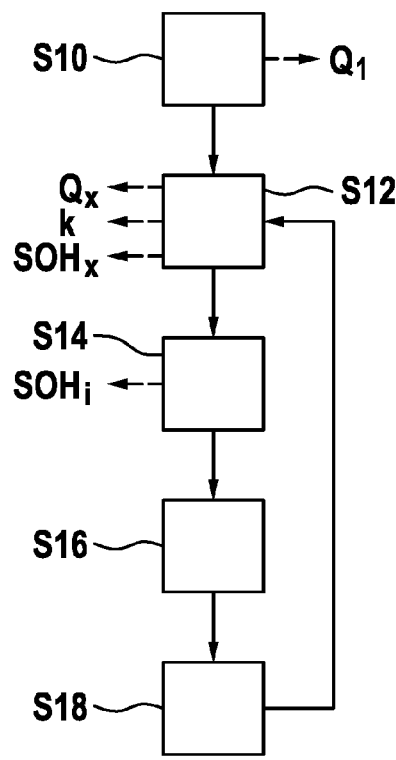
FIG. 2 shows a flow diagram for a method for determining a state of health of one or more batteries according to an embodiment of the invention.

FIG. 2 shows a flow diagram for a state of health determination method and battery management method that may be performed by the system 10 of FIG. 1.

In step S10, an initial charging capacity $Q_1$ is determined for the battery 14. The initial capacity may be measured initially for each battery 14 or may be provided for each type of battery. For example, the battery supplier 26 may measure the initial charging capacity $Q_1$ for each battery he provides to the system 10. The initial charging capacity may be provided to the controller 16 from the central database 24 via the communication connection.

The initial charging capacity $Q_1(T_1,i_1)$ may be determined with respect to a specific temperature $T_1$ and a specific charging current $i_1$.

In step S12, the controller 16 determines that a charging state window has been entered and collects a number of battery current values until the charging state window is left. The measurements may be performed during use, i.e. normal operation of the battery 14. None special "diagnostic" discharge into the electric grid 20 is needed.

The entering and leaving of the charging state window may be determined with a charging state or "state of charge" SOC that is additionally determined by the controller 16 based on additional measurements with respect to the battery 14. For example, the additional measurements may include a voltage across the battery 14 and/or a temperature of the battery 14.

The charging state SOC may be provided as percentage value and, for example, the charging state window may be a fixed interval from an upper border $SOC_U=80\%$ to a lower border $SOC_L=50\%$. However, it also may be possible that only the width $\Delta SOC=SOC_U-SOC_L$ and/or only one of the borders is fixed and the other quantities are determined dynamically.

The measurement values may be determined, when the charging state of the battery 14 is increasing or when the charging state of the battery 14 is decreasing.

From the measured battery current values, a change in charge $Q_x$ is determined by summing up the current values. This may be seen as "Coulomb counting" in the charging state window. The change in charge $Q_x$ may be provided in Ah.

Furthermore, during the charging state window, battery temperature values and battery current values may be determined from which an average temperature $T_x$ and an average current $i_x$ is calculated.

With the help of the average temperature $T_x$ and an average current $i_x$, a correction factor $k(T_x, i_x)$ is determined. For example, the correction factor k may be taken from a lookup table, which is stored in the controller 16. The correction factor k is used for modifying the actual charging capacity (i.e. the change in charge $Q_x$ divided by the width $\Delta SOC$ of the charging window), so it can be compared with the initial charging capacity $Q_1$, which has the reference temperature $T_1$ and reference current $i_1$.

An actual state of health $SOH_x$ is then calculated as follows $$SOH_x=Q_x(T_x,i_x)/(k(T_x,i_x)*\Delta SOC*Q_1(T_1,i_1))$$

The change in charge $Q_x$ is divided by the correction factor k, the width $\Delta SOC$ of the charging window and the initial charging capacity $Q_1$ of the battery 14.

In step S14, an averaged state of health $SOH_i$ is determined by calculating a sliding average of the actual state of health $SOH_x$ with at least one previous determined state of health. With a sliding average calculation, the chance of error due to extreme currents and temperatures may be lowered.

For example, the averaged state of health $SOH_i$ may be determined from the actual and the last averaged state of health:

$$SOH_i=b*SOH_x+(1-b)*SOH_{i-1}$$

b, which may be 0.9, for example, is a non-dimensional parameter. A higher value weights the historical measurements over the current one, whereas a lower b value weights the existing measurements more.

The averaged state of health $SOH_i$ may then be employed in different applications, as proposed with optional steps S16 and S18.

In step S16, the averaged state of health $SOH_i$ is used internally in the controller 16. For example, an upper threshold temperature for the battery 14 may be determined from the averaged state of health $SOH_i$. This upper threshold temperature may be taken from a lookup table and may be used for a SOH-dependent derating of the battery 14. The threshold temperature may be used for controlling the charging and decharging of the battery 14, such that a temperature of the battery 14 is always lower than the upper threshold temperature.

It also is possible to update an actual full charging capacity FCC in the controller 16, which may be used to recalibrate the SOC calculation. This may be done based on the actual state of health or the averaged state of health.

$$FCC=Q_1(T_1,i_1)*SOH_x \text{ or } FCC=Q_1(T_1,i_1)*SOH_i$$

In step S18, the averaged state of health $SOH_i$ is used for managing a plurality of batteries 14, i.e. a fleet of batteries.

The averaged state of health $SOH_i$ is sent to the central server 22, which stores it in the central database 24.

The state of health $SOH_i$ is compared with a critical threshold value, and, when the state of health is below the threshold value, a replacement of the battery 14 may be scheduled. For example, information about the scheduled replacement may be sent to the battery supplier 26 and/or to an owner of the battery 14.

It also is possible to already order a new battery and/or to schedule a replacement, when the battery has reached nearly its end of life. New batteries may be stored in a stock, which stock is maintained based on the states of health $SOH_i$ of the fleet of batteries.

As indicated by the arrow back to step S12, the determination of the state of health $SOH_i$ may be regularly repeated, for example in regular time intervals or regularly with respect to the charging cycles of the battery 14.

For example, the determination of the state of health $SOH_i$ is repeated at least every 10 charging cycles and/or at least every 10 days. Since the method may be performed during normal operation of the battery 14, it may be performed much often than conventional methods.

Furthermore, the determination of the state of health $SOH_i$ may be restricted to specific battery temperatures. The method may only be performed, when a temperature during determination of the change in charge $Q_x$ in step S12 is higher than a lowest temperature. In such a way, big errors, which may depend on a temperature strongly different from the initial charging temperature $T_1$, may be avoided.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 battery charging and management system
12 battery system
14 rechargeable battery 16 controller
18 photovoltaic panel
20 electrical grid
22 central server
24 central database
26 battery supplier
$Q_1$ initial charging capacity
$Q_x$ change in charge
SOH state of health
$SOH_x$ actual state of health
$SOH_i$ averaged state of health
k correction factor

The invention claimed is:

1. A method for determining a state of health of a rechargeable battery, the method comprising:
   determining a change in charge within an upper border and a lower border of a charging state window, the change in charge being determined by summing up current values measured within the charging state window;
   determining an actual state of health by scaling the change in charge with the width of the charging state window and dividing by an initial charging capacity of the battery;
   determining an averaged state of health by calculating a sliding average of the actual state of health with at least one previous determined state of health;
   wherein during determining of the change in charge, an average current is determined by measuring battery current values and calculating an average of these values;
   wherein the initial charging capacity is multiplied with a correction factor dependent on the average current for adapting the initial charging capacity, which has been determined for a reference current, to the average current.

2. The method of claim 1,
   wherein a charging state used for determining, whether the charging state window has been entered and has been left, is determined based on additional measurements with respect to the battery.

3. The method of claim 2,
   wherein the additional measurements include a voltage across the battery and/or a temperature of the battery.

4. The method of claim 1
   wherein the change in charge is determined during charging of the battery, when a charging state of the battery is increasing.

5. The method of claim 1,
   wherein the change in charge is determined during discharging of the battery, when a charging state of the battery is decreasing.

6. The method of claim 1,
   wherein during determining of the change in charge, an average temperature is determined;
   wherein the initial charging capacity is multiplied with a correction factor dependent on the average temperature and the average current for adapting the initial charging capacity, which has been determined for a reference temperature and/or a reference current, to the average temperature and/or average current.

7. The method of claim 6,
   wherein the average temperature is determined by measuring battery temperature values and calculating an average of these values.

8. The method of claim 1,
   wherein the correction factor is taken from a lookup table referenced by temperature and/or current.

9. The method of claim 1,
   wherein the borders of the charging state window are fixed values;
   wherein the upper border is set between 90% and 50% of a charging capacity;
   wherein the lower border is set between 70% and 30% of a charging capacity.

10. The method of claim 1,
    wherein the charging state window has a width of a least 25% of a charging capacity.

11. The method of claim 1,
    wherein the determination of the state of health is regularly repeated; and/or
    wherein the determination of the state of health is repeated at least every 10 charging cycles; and/or
    wherein the determination of the state of health is only performed, when a temperature during determination of the change in charge is higher than a lowest temperature.

12. The method of claim 1, further comprising:
    determining an upper threshold temperature for the battery from the averaged state of health;
    controlling the charging and discharging of the battery, such that a temperature of the battery is lower than the upper threshold temperature.

13. The method of claim 2, wherein the change in charge is determined during charging of the battery, when a charging state of the battery is increasing.

14. The method of claim 2, wherein the change in charge is determined during discharging of the battery, when a charging state of the battery is decreasing.

15. The method of claim 2, wherein during determining of the change in charge, an average temperature is determined;
    wherein the initial charging capacity is multiplied with a correction factor dependent on the average temperature and the average current for adapting the initial charging capacity, which has been determined for a reference temperature and/or a reference current, to the average temperature and/or average current.

16. The method of claim 15, wherein the average temperature is determined by measuring battery temperature values and calculating an average of these values.

17. The method of claim 2, wherein the correction factor is taken from a lookup table referenced by temperature and/or current.

18. A battery controller structured to determine a state of health of a rechargeable battery, the battery controller operable to execute instructions comprising:
    determine a change in charge within an upper border and a lower border of a charging state window, the change in charge being determined by summing up current values measured within the charging state window;
    determine an actual state of health by scaling the change in charge with the width of the charging state window and dividing by an initial charging capacity of the battery;
    determine an averaged state of health by calculating a sliding average of the actual state of health with at least one previous determined state of health;
    wherein during determining of the change in charge, an average current is determined by measuring battery current values and calculating an average of these values;

wherein the initial charging capacity is multiplied with a correction factor dependent on the average current for adapting the initial charging capacity, which has been determined for a reference current, to the average current.

19. A method for determining the state of health of a fleet of rechargeable batteries, the method comprising:
   receiving a state of health of one of the batteries of the fleet of batteries in a central database, the state of health being determined by acts including:
   determining a change in charge within an upper border and a lower border of a charging state window, the change in charge being determined by summing up current values measured within the charging state window;
   determining an actual state of health by scaling the change in charge with the width of the charging state window and dividing by an initial charging capacity of the battery;
   determining an averaged state of health by calculating a sliding average of the actual state of health with at least one previous determined state of health;
   wherein during determining of the change in charge, an average current is determined by measuring battery current values and calculating an average of these values;
   wherein the initial charging capacity is multiplied with a correction factor dependent on the average current for adapting the initial charging capacity, which has been determined for a reference current, to the average current;
   comparing the state of health with a threshold value, and, when the state of health is below the threshold value, scheduling a replacement of the battery;
   sending information about the scheduled replacement to a battery supplier and/or to an owner of the battery.

20. A battery management system, comprising:
   a central server including a central database structured to receive a state of health of one of the batteries of a fleet of batteries;
   at least one battery charging controller operable to execute instructions comprising:
   determine a change in charge within an upper border and a lower border of a charging state window, the change in charge being determined by summing up current values measured within the charging state window;
   determine an actual state of health by scaling the change in charge with the width of the charging state window and dividing by an initial charging capacity of the battery;
   determine an averaged state of health by calculating a sliding average of the actual state of health with at least one previous determined state of health;
   wherein during determining of the change in charge, an average current is determined by measuring battery current values and calculating an average of these values;
   wherein the initial charging capacity is multiplied with a correction factor dependent on the average current for adapting the initial charging capacity, which has been determined for a reference current, to the average current;
   compare the state of health with a threshold value, and, when the state of health is below the threshold value, scheduling a replacement of the battery; and
   send information about the scheduled replacement to a battery supplier and/or to an owner of the battery.

* * * * *